(12) United States Patent
Lamb et al.

(10) Patent No.: US 7,375,406 B2
(45) Date of Patent: May 20, 2008

(54) THERMOPLASTIC OVERMOLDING FOR SMALL PACKAGE TURBOCHARGER SPEED SENSOR

(75) Inventors: Wayne A. Lamb, Freeport, IL (US); Scott E. Michelhaugh, Freeport, IL (US); Peter A. Schelonka, Plymouth, MN (US); Joel D. Stolfus, Freeport, IL (US)

(73) Assignee: Honeywell International Inc., Morristown, NJ (US)

( * ) Notice: Subject to any disclaimer, the term of this patent is extended or adjusted under 35 U.S.C. 154(b) by 205 days.

(21) Appl. No.: 11/314,328

(22) Filed: Dec. 20, 2005

(65) Prior Publication Data

US 2007/0139044 A1 Jun. 21, 2007

(51) Int. Cl.
*H01L 29/82* (2006.01)
*G01V 3/00* (2006.01)

(52) U.S. Cl. ............... 257/424; 257/226; 257/444; 324/345; 324/377; 324/219; 324/160; 324/173; 29/712

(58) Field of Classification Search ............ 257/226, 257/424, 427, 444; 29/709–712; 361/26, 361/27; 324/345, 377, 200, 219, 160–167, 324/173

See application file for complete search history.

(56) References Cited

U.S. PATENT DOCUMENTS

| 4,227,372 | A | 10/1980 | Kakimoto et al. | ............ 60/602 |
| 4,571,945 | A | 2/1986 | Inada et al. | ............ 60/602 |
| 4,957,876 | A | 9/1990 | Shibata et al. | |
| 5,825,091 | A * | 10/1998 | Adams | ............ 257/777 |
| 5,873,248 | A | 2/1999 | Houtz | ............ 60/602 |
| 5,957,547 | A * | 9/1999 | Schliebe et al. | ......... 303/119.3 |
| 5,974,801 | A | 11/1999 | Houtz | ............ 60/602 |
| 6,067,798 | A | 5/2000 | Okada et al. | ............ 60/602 |
| 6,131,270 | A | 10/2000 | Van Den Berg | |
| 6,234,149 | B1 | 5/2001 | Mills et al. | ............ 123/486 |
| 6,378,306 | B2 | 4/2002 | Koelle et al. | ............ 60/605.1 |
| 6,539,714 | B1 | 4/2003 | Wang | ............ 60/598 |
| 6,546,728 | B2 | 4/2003 | Schmidt et al. | ............ 60/602 |
| 6,651,430 | B2 | 11/2003 | Meier et al. | ............ 60/602 |
| 6,871,499 | B1 | 3/2005 | Allen et al. | ............ 60/608 |

(Continued)

FOREIGN PATENT DOCUMENTS

EP 0637081 A2 2/1995
WO WO 2007/067422 A1 6/2007

*Primary Examiner*—Jasmine J Clark
(74) *Attorney, Agent, or Firm*—Kermit D. Lopez; Luis M. Ortiz

(57) ABSTRACT

A sensor package apparatus includes a lead frame substrate that supports one or more electrical components, which are connected to and located on the lead frame substrate. A plurality of wire bonds are also provided, which electrically connect the electrical components to the lead frame substrate, wherein the lead frame substrate is encapsulated by a thermoset plastic to protect the plurality of wire bonds and at least one electrical component, thereby providing a sensor package apparatus comprising the lead frame substrate, the electrical component(s), and the wire bonds, while eliminating a need for a Printed Circuit Board (PCB) or a ceramic substrate in place of the lead frame substrate as a part of the sensor package apparatus. A conductive epoxy and/or solder can also be provided for maintaining a connection of the electrical component(s) to the lead frame substrate. The electrical components can constitute, for example, an IC chip and/or a sensing element (e.g., a magnetoresistive component) or sense die.

18 Claims, 7 Drawing Sheets

U.S. PATENT DOCUMENTS

| | | | |
|---|---|---|---|
| 6,880,337 B2 | 4/2005 | Masuda | 60/608 |
| 6,880,518 B2 | 4/2005 | Shiraishi et al. | 123/295 |
| 6,886,337 B2 | 5/2005 | Friedrich et al. | 60/614 |
| 2004/0118227 A1 | 6/2004 | Tokunaga et al. | |
| 2005/0017709 A1 | 1/2005 | Stolfus et al. | 324/174 |
| 2005/0141584 A1* | 6/2005 | Ohe et al. | 372/108 |

* cited by examiner

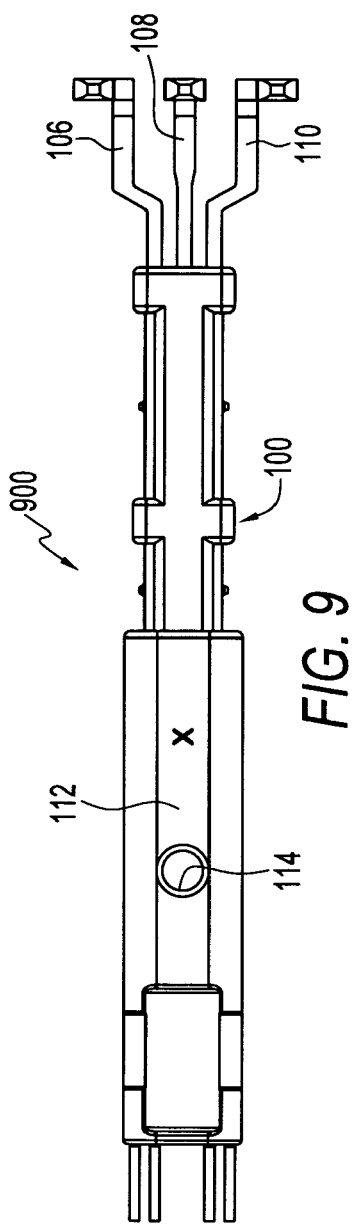
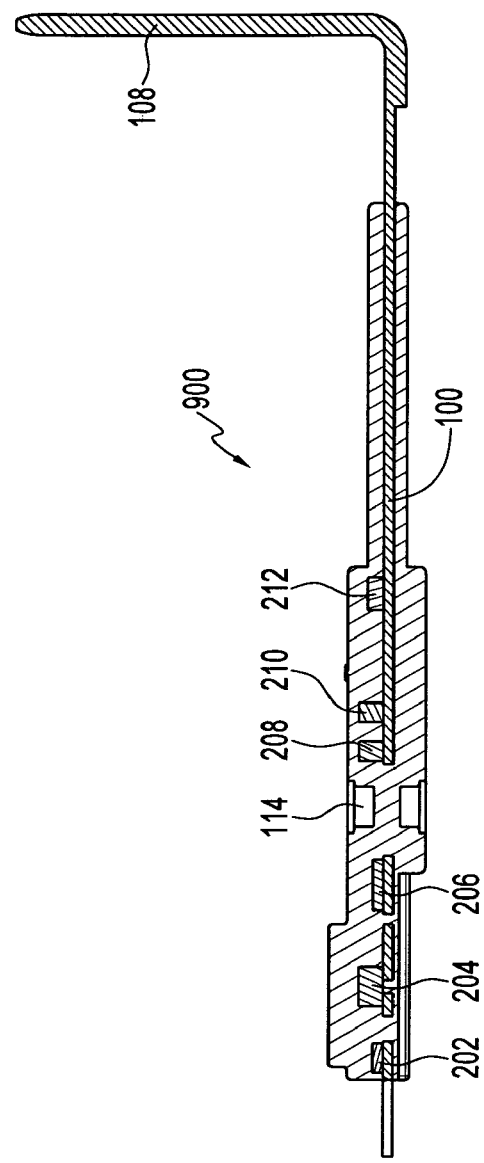
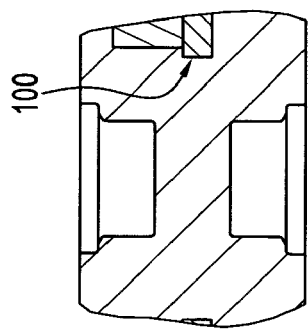
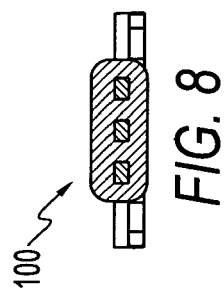

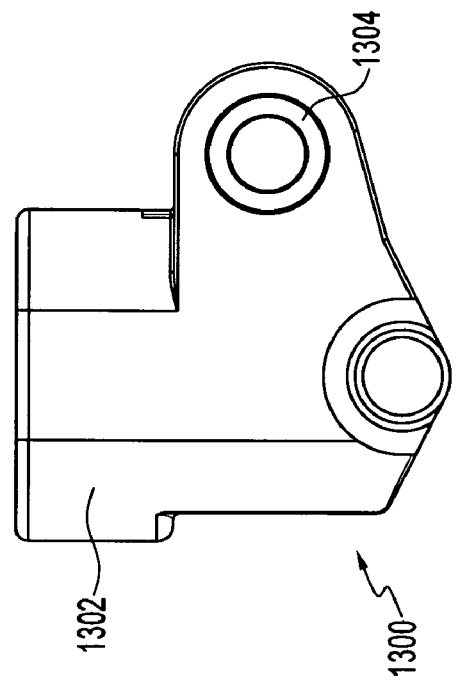
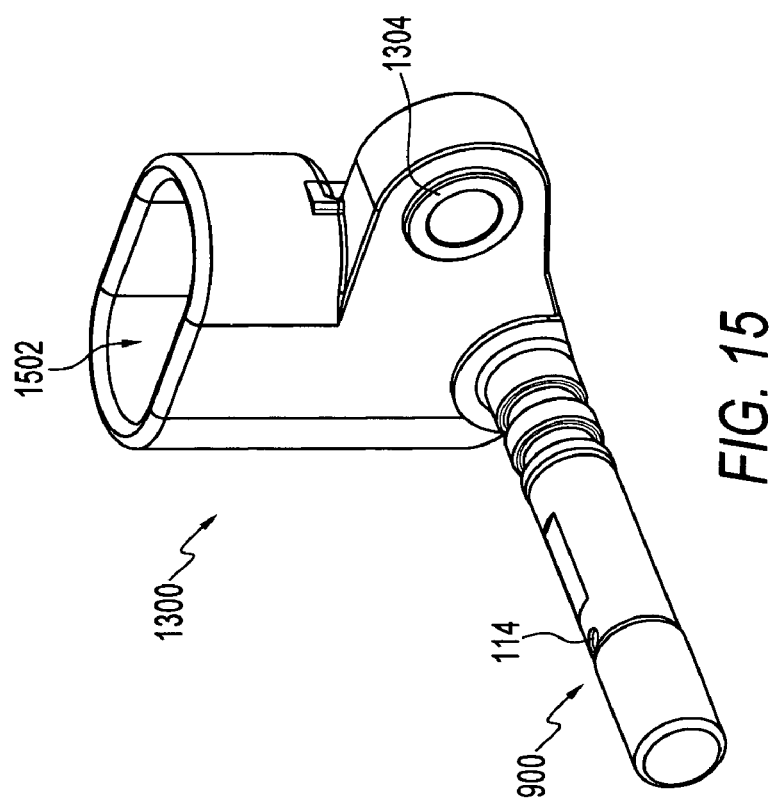

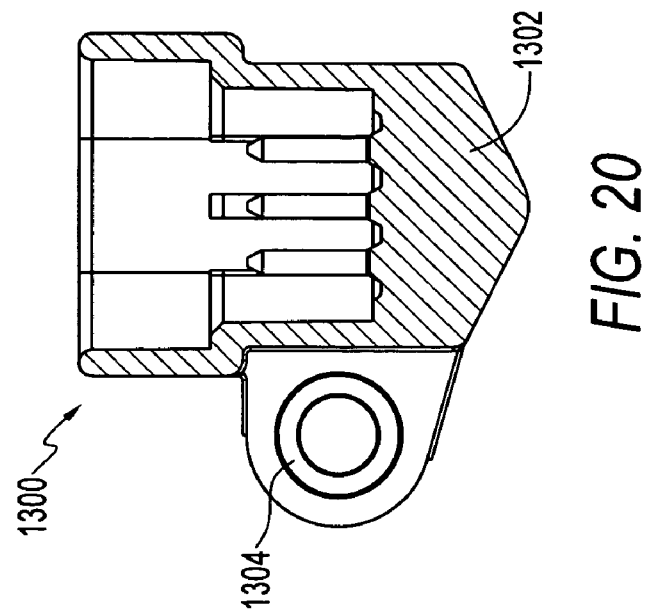
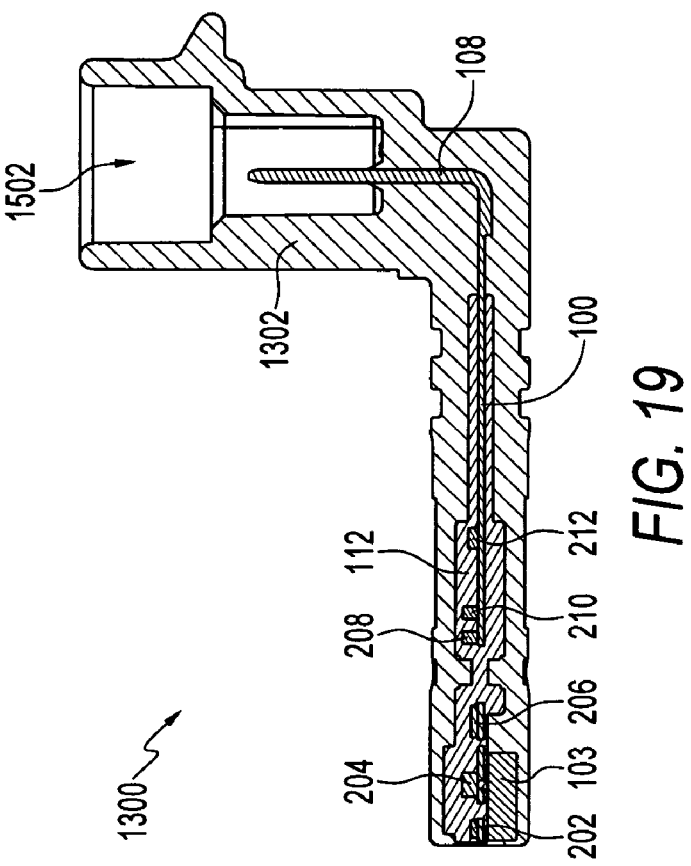

THERMOPLASTIC OVERMOLDING FOR SMALL PACKAGE TURBOCHARGER SPEED SENSOR

TECHNICAL FIELD

Embodiments are generally related to sensing devices and methods. Embodiments also relate to speed sensors. Embodiments additionally relate to turbochargers utilized in automotive systems.

BACKGROUND OF THE INVENTION

Turbochargers are utilized in engines for improving the output power of the engine by increasing the airflow charge to the cylinders to support an increased fuel charge. Turbochargers are well known devices for pressurizing intake air entering the combustion chambers of an internal combustion engine to thereby increase the efficiency and power output of the engine. In general, pressurizing the intake air increases the quantity of air entering the engine cylinders during the intake stroke, and this allows more fuel to be utilized in establishing a desired air-to-fuel ratio. Increased available engine output torque and power is thereby realized.

In a turbocharged engine, the exhaust manifold of the engine is fluidly coupled to a turbine component of the turbocharger via an exhaust conduit, and the exhaust gas flowing through the exhaust conduit causes a turbine wheel within the turbine to rotate at a rate determined by the pressure and flow rate of exhaust gas. A compressor wheel within a compressor component of the turbocharger is mechanically coupled to the turbine wheel, and is therefore rotatably driven by the turbine wheel. An inlet of the compressor receives fresh ambient air, and an outlet of the compressor is fluidly coupled to the intake manifold of the engine via an intake conduit. The rotatably driven action of the compressor wheel increases the amount of intake air supplied to the intake conduit, thereby resulting in an increased, or so-called "boost", pressure therein.

With the development of increasingly sophisticated turbocharger and related automotive components, a need has arisen for extremely small package designs for turbocharger speed sensors utilized, for example, in diesel and gasoline engines. Current turbocharger speed sensors are used chiefly in laboratory settings or in a very limited basis at the center of a turbocharger housing. Locating the speed sensor instead on the compressor housing of the turbocharger takes advantage of cooler temperatures for sensor operations. The compressor housing location means that the sensor detects the speed of the compressor wheel as it spins at high RPM in the turbocharger. Such an arrangement also means that a hole or sensor bore through the compressor housing is required for the sensor face to be in close proximity to the fins of the compressor wheel.

Because the compressor wheel and compressor housing have been machined to close precision and the compressor wheel has been properly balanced, the added sensor bore and sensor must provide for a minimal operational impact. To prevent as little disruption as possible to the compressor wheel spinning at high RPM and to the airflow in the compressor housing, the speed sensor package should be configured in as compact and small an arrangement as possible. A small speed sensor package is also desirable for mounting or installation of the sensor on smaller sized turbochargers.

The cooler temperatures of approximately 190° C. on the compressor side of the turbocharger allow all of the integrated circuits (IC's) and signal conditioning electronics to be packaged together and over-molded with a thermoset and then the thermoset subassembly overmolded with a thermoplastic into a single package with an integral connector. Such a configuration eliminates the need for a pigtail or wire harness version of the sensor to remotely locate associated electrical components. A single integrated package can therefore reduce the number of components needed along with the associated material costs and manufacturing processes that would otherwise be required in a pigtail version. An integral connector version can thus allow for an enhanced sealing capability by eliminating multiple interconnects that would be necessary in a pigtail version.

In prior art sensor packages, the sense die is typically encapsulated in a thermoset package with external leads. The resulting IC package is then placed on a substrate such as a PCB or ceramic, along with other electronics. The substrate is then attached to a plastic carrier of some sort, encapsulated with thermoset for protection and then over-molded again with a thermoplastic to provide the final sensor package with integral connectors. A need exists for a sensor package and apparatus, which would allow for a much smaller sensor package than that afforded by conventional sensor packaging techniques and devices. It is believed that the sensor packaging methodology and devices described herein address this continuing need.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for an improved sensor.

It is another aspect of the present invention to provide for an improved speed sensor package.

It is a further aspect of the present invention to provide for an improved turbochargers speed sensor and packaging apparatus thereof.

The aforementioned aspects and other objectives and advantages can now be achieved as described herein. A sensor package apparatus and method are disclosed, including a lead frame substrate that supports one or more electrical components. Such electrical components are generally connected to and located on the lead frame substrate. A plurality of wire bonds are also provided, which electrically connect the electrical components to the lead frame substrate, wherein the lead frame substrate is encapsulated by a thermoset plastic to protect the plurality of wire bonds and at least one electrical component, thereby providing a sensor package apparatus comprising the lead frame substrate, the electrical component(s), and the wire bonds, while eliminating a need for a Printed Circuit Board (PCB) or a ceramic substrate in place of the lead frame substrate as a part of the sensor package apparatus. A conductive epoxy and/or solder can also be provided for maintaining a connection of the electrical component(s) to the lead frame substrate. The lead frame substrate encapsulated by the thermoplastic comprises a thermoset plastic carrier for constructing the sensor package apparatus. The electrical components can constitute, for example, an IC chip and/or a sensing element (e.g., a magnetoresistive component) or sense die.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

FIG. 7 illustrates an additional view of the lead frame depicted in FIGS. 1-6, in accordance with a preferred embodiment;

FIG. 8 illustrates a section D-D view of the lead frame depicted in FIGS. 1-7, in accordance with a preferred embodiment;

FIG. 9 illustrates a sensor subassembly, which can be implemented in accordance with a preferred embodiment;

FIG. 10 illustrates a side section A-A view of the sensor subassembly depicted in FIG. 9 in accordance with a preferred embodiment;

FIG. 15 illustrates a reverse perspective view of the speed sensor depicted in FIGS. 13-14 in accordance with a preferred embodiment;

FIG. 16 illustrates a detailed view of a terminal that forms a part of the speed sensor depicted in FIGS. 13-15 in accordance with a preferred embodiment;

FIG. 17 illustrates a detailed view of a retractable pin accepting feature, which can be adapted for use in forming the sensor subassembly depicted in FIGS. 9-13 and the speed sensor depicted in FIGS. 13-16 in accordance with a preferred embodiment;

FIG. 18 illustrates a side view of the speed sensor depicted in FIGS. 13-16 in accordance with a preferred embodiment;

FIG. 19 illustrates a side sectional view of the speed sensor depicted in FIGS. 13-18 in accordance with a preferred embodiment; and FIG. 20 illustrates a sectional view of the speed sensor depicted in FIGS. 13-19 in accordance with a preferred embodiment.

DETAILED DESCRIPTION

The particular values and configurations discussed in these non-limiting examples can be varied and are cited merely to illustrate at least one embodiment and are not intended to limit the scope thereof.

Figure 1:
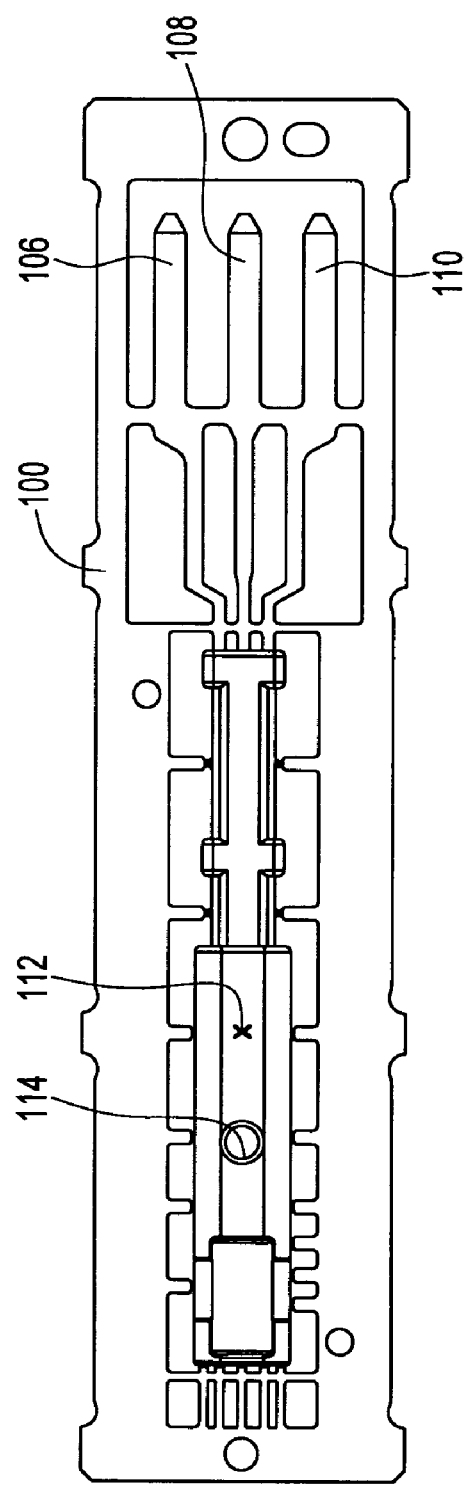
FIG. 1 illustrates a top view of a lead frame, which can be implemented in accordance with a preferred embodiment.

FIG. 1 illustrates a top view of a lead frame 100, which can be implemented in accordance with a preferred embodiment. Note that in FIGS. 1-20, identical or similar parts or elements are generally indicated by identical reference numerals. Lead frame 100 can be configured to include a magnetic sensing component or magnetoresistive sensing element 202, such as, for example, a GMR or AMR transducer. Lead frame 100 can be further configured to include a plurality of lead frame terminals 106, 108, and 110. A thermoset material 112 can be molded on the lead frame 100 and about the magnetoresistive sensing element 202. A circular cavity 114 can be formed in the thermoset material 112 on the lead frame 100.

Figure 2:
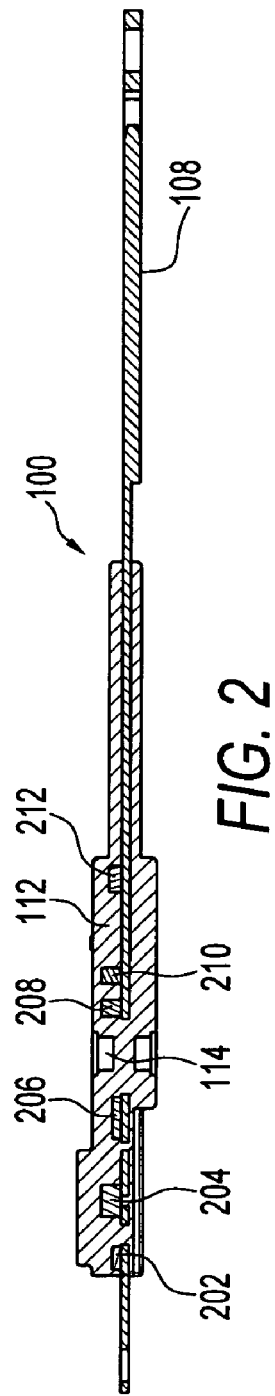
FIG. 2 illustrates a section A-A side view of the lead frame depicted in FIG. 1, in accordance with a preferred embodiment.

FIG. 2 illustrates a section A-A side view of the lead frame depicted in FIG. 1, in accordance with a preferred embodiment A plurality of electrical components 202, 204, 206, 208, 210, and 212 can be formed on the lead frame 100. The thermoset material 112 can also be formed over the electrical components 202, 204, 206, 208, 210, and 212. Note that the thermoset material 112 can be implemented as an epoxy molding compound. The electrical components 202, 204, 206, 208, 210, and 212 can be, for example, conductors, wires, capacitors, connectors, coupling capacitors and so forth, depending upon design considerations. A thermoplastic material 1302 (e.g., see FIGS. 18-19) can be, for example, a material such as Polyphenylene Sulfide (PPS). The PPS can flow very well in thin walls, such as 0.25 inch to 0.030 inch side walls and 0.010 inch to 0.015 inch face thicknesses often required in speed sensors applications, such as that depicted in FIGS. 13-20 herein. The magnetoresistive sensing element 202, the internal electrical and/or other (e.g. mechanical) components 204, 206, 208, 210, and 212 can be over-molded with the thermoset material 112 (e.g., epoxy), which can survive the high temperature requirements (e.g., 200° C. and greater) that are often found in modern speed sensor applications, such as, for example, turborcharger speed sensors utilized in automotive environments.

Figure 3:
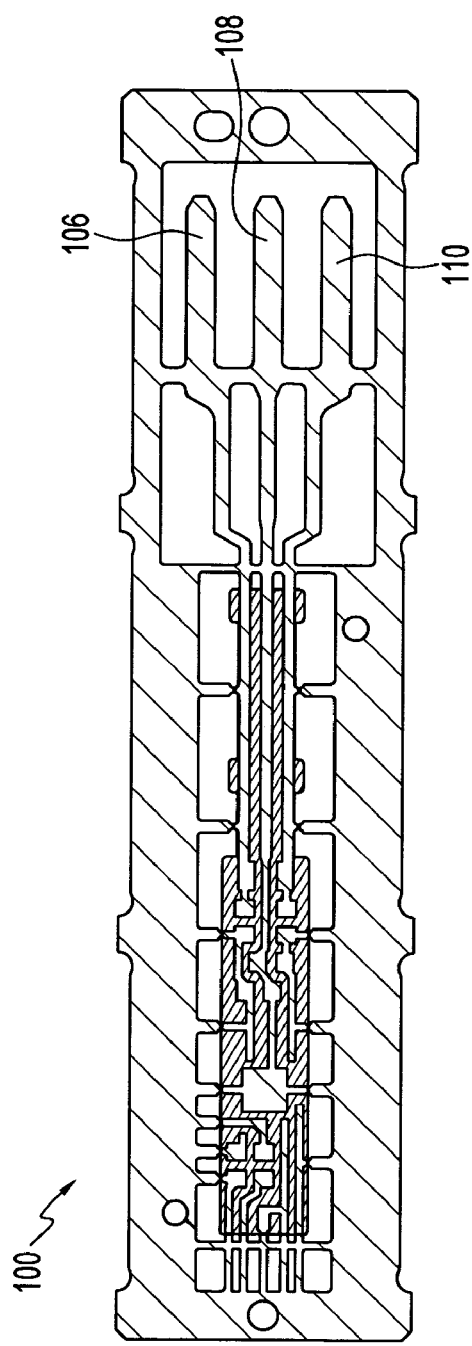
FIG. 3 illustrates a section B-B bottom view of the lead frame depicted in FIGS. 1-2, in accordance with a preferred embodiment.
Figure 6:
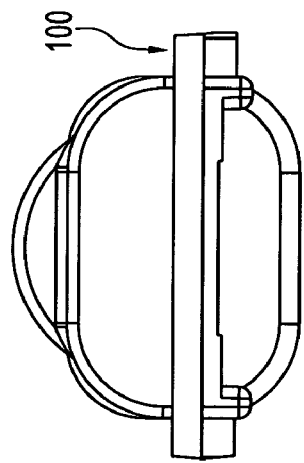
FIG. 6 illustrates a detailed view of the lead frame depicted in FIGS. 1-5, in accordance with a preferred embodiment.
Figure 5:
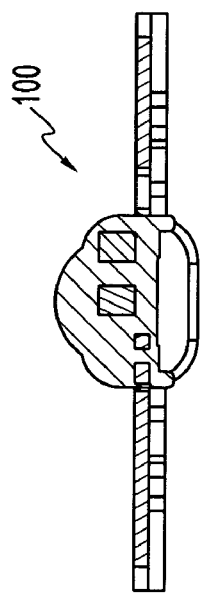
FIG. 5 illustrates a section C-C detailed view of the lead frame depicted in FIGS. 1-4 in accordance with a preferred embodiment.
Figure 4:
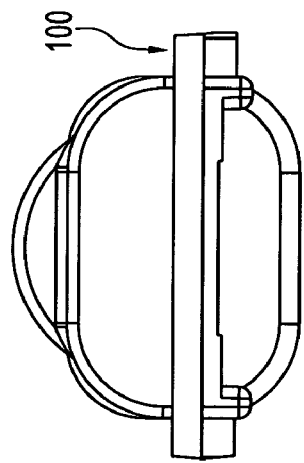
FIG. 4 illustrates a detailed view of the lead frame depicted in FIGS. 1-3, in accordance with a preferred embodiment.

FIG. 3 illustrates a section B-B bottom view of the lead frame 100 depicted in FIGS. 1-2, in accordance with a preferred embodiment. Similarly, FIG. 4 illustrates a detailed view of the lead frame 100 depicted in FIGS. 1-3, in accordance with a preferred embodiment. Likewise, FIG. 5 illustrates a section C-C detailed view of the lead frame 100 depicted in FIGS. 1-4 in accordance with a preferred embodiment. Also, FIG. 6 illustrates a detailed view of the lead frame 100 depicted in FIGS. 1-5, in accordance with a preferred embodiment. FIG. 7 illustrates an additional view of the lead frame 100 depicted in FIGS. 1-6, in accordance with a preferred embodiment. Finally, FIG. 8 illustrates a section D-D view of the lead frame depicted in FIGS. 1-7, in accordance with a preferred embodiment.

Figure 12:
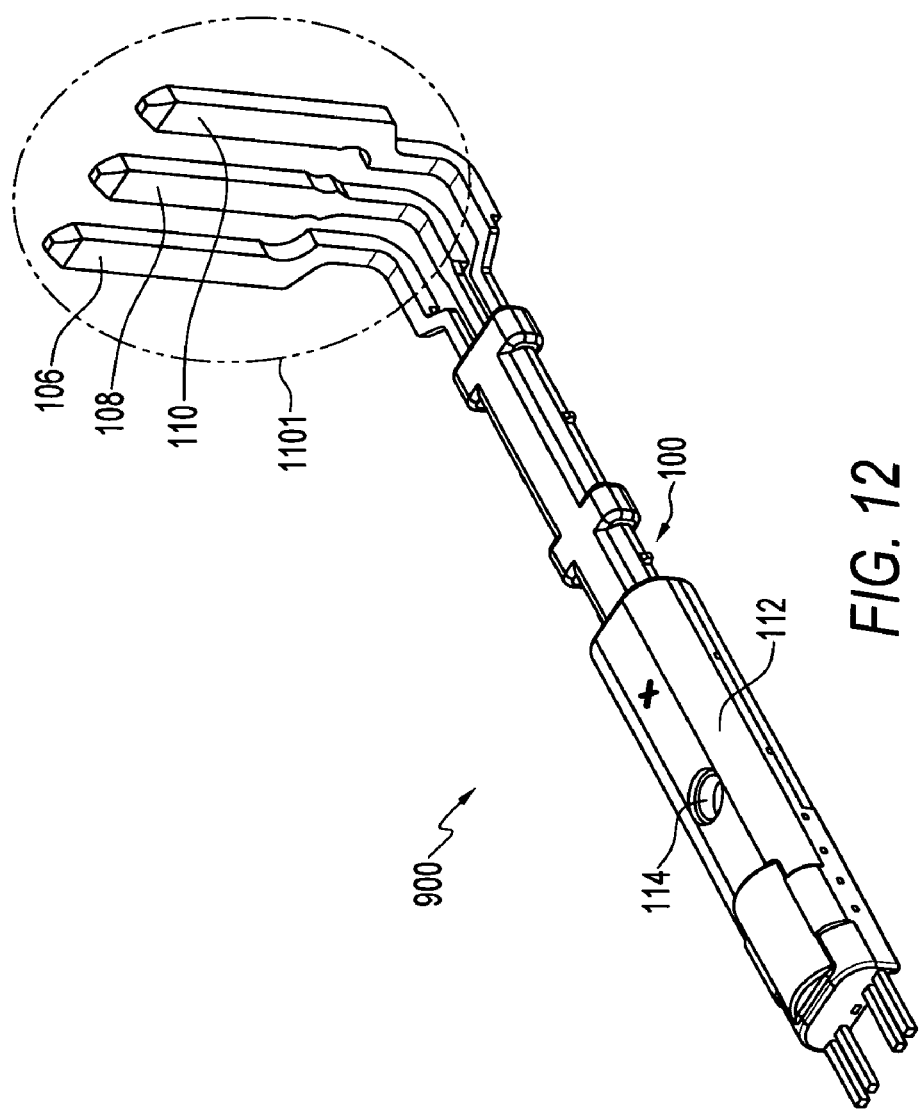
FIG. 12 illustrates a perspective view of the sensor subassembly depicted in FIGS. 9-11 in accordance with a preferred embodiment.
Figure 11:
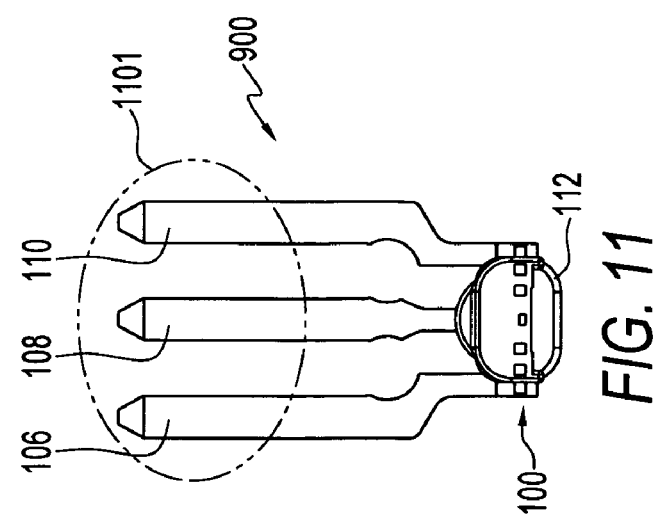
FIG. 11 illustrates a cut-away view of a tie bar that forms a part of the sensor subassembly depicted in FIGS. 9-10 in accordance with a preferred embodiment.

FIG. 9 illustrates a sensor subassembly 900, which can be implemented in accordance with a preferred embodiment. Note that in FIGS. 1-12, identical or similar parts or elements are generally indicated by identical reference numerals. The sensor subassembly 900 illustrated in FIGS. 9-12 incorporates and is formed from the lead frame 100 depicted in FIGS. 1-8. FIG. 10 illustrates a side section A-A view of the sensor subassembly 900 depicted in FIG. 9 in accordance with a preferred embodiment. FIG. 11 illustrates a view of external terminals with tie bar cut-away 1101 that forms a part of the sensor subassembly 900 depicted in FIGS. 9-10 in accordance with a preferred embodiment. The external terminals 1101 are generally formed from and include lead frame terminals 106, 108, 110. FIG. 12 illustrates a perspective view of the sensor subassembly 900 depicted in FIGS. 9-11 in accordance with a preferred embodiment. The external terminals 1101 are generally depicted in FIG. 11 and FIG. 12 as surrounded by dashed lines.

The thermoplastic overmold formed from the thermoplastic material 1302 can be accomplished over the sensor subassembly 900, which includes a thermoset package internal electronic components, such as, for example, the components 202, 204, 206, 208, 210, and 212. Note that components 202, 204, 206, 208, 210, and 212 can not only constitute electrical and/or mechanical components, but may be, for example, small integrated circuit (IC) chips or sense die components, depending upon design considerations. The thermoset plastic can also include the attached magnetoresistive component 202 and/or a magnet 103 as shown in FIG. 19, along with a custom second level connector lead frame if necessary.

The lead frame terminals 106, 108, and 110 and other features that form a part of the resulting thermoset package can be utilized to locate the sensor subassembly 900 in the mold (i.e., thermoplastic material) itself. One or more retractable pins (e.g., see the retractable pin accepting feature 1700 depicted in FIG. 17) can be pulled to allow for a complete coverage of the thermoplastic material 1302 about the sensor subassembly 900. Various styles of integral connectors and mounting flange orientations can be accomplished with thermoplastic molding for specific user requirements, depending upon design considerations and goals.

Figure 13:
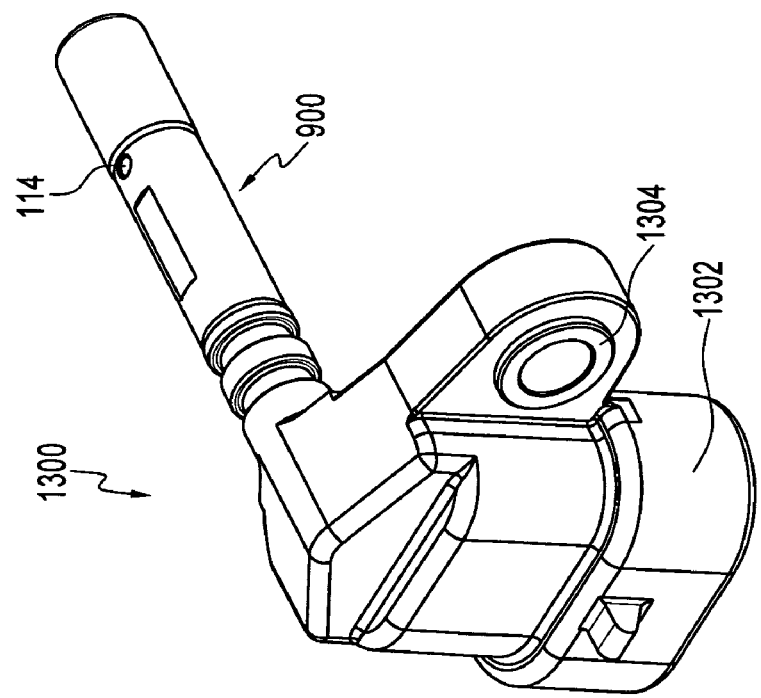
FIG. 13 illustrates a top perspective view of a speed sensor, which can be implemented in accordance with a preferred embodiment.

FIG. 13 illustrates a top perspective view of a speed sensor 1300, which can be implemented in accordance with a preferred embodiment. Note that in FIGS. 13-20, identical or similar parts are generally indicated by identical reference numerals. The speed sensor 1300 can be implemented as, for example, a turbocharger speed sensor. The sensor subassembly 900 described above with respect to FIGS. 9-12 can be incorporated into the speed sensor 1300. In general, the sensor subassembly 900 can be surrounded by a thermoplastic material 1302. A metal bushing or other mounting feature 1304 can be overmolded or installed into the speed sensor 1300 for mounting in the application.

Figure 14:
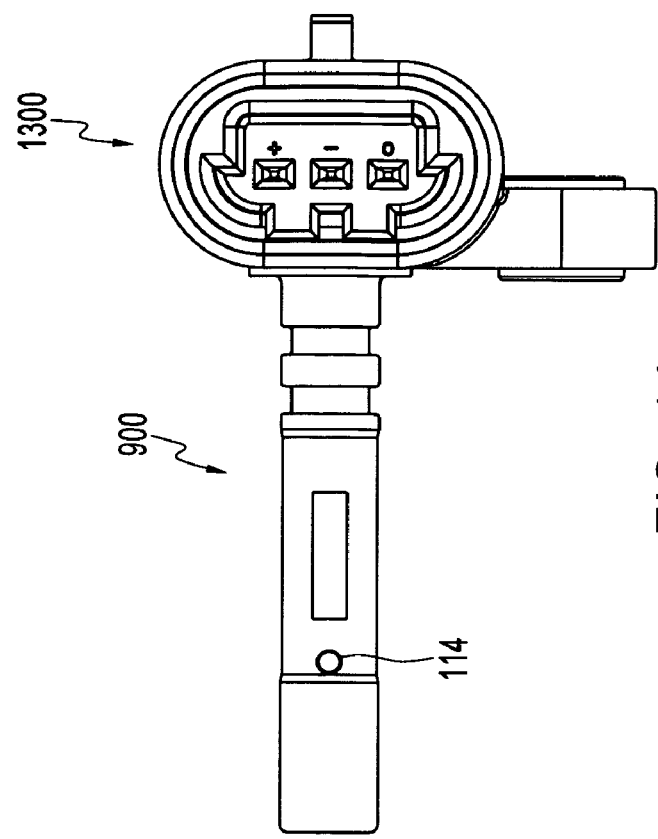
FIG. 14 illustrates a bottom view of the speed sensor depicted in FIG. 13 in accordance with a preferred embodiment.

FIG. 14 illustrates a bottom view of the speed sensor 1300 depicted in FIG. 13 in accordance with a preferred embodiment. The speed sensor 1300 can constitute a sensor overmold apparatus for use in speed sensing applications (e.g., turborcharger speed sensor). FIG. 15 illustrates a reverse perspective view of the speed sensor 1300 depicted in FIGS. 13-14 in accordance with a preferred embodiment. In the view illustrated in FIG. 15, one style of an integral connector 1502 is also depicted. FIG. 16 illustrates a detailed view of a terminal 1600 that forms a part of the speed sensor 1300 depicted in FIGS. 13-15 in accordance with a preferred embodiment. FIG. 17 illustrates a detailed view of a retractable pin accepting feature 1700, which can be adapted for use in forming the sensor subassembly 900 depicted in FIGS. 9-13 and the speed sensor 1300 depicted in FIGS. 13-16 in accordance with a preferred embodiment. The accepting feature 1700 functions as a feature (e.g., socket) where a retractable pin can be located and/or mated, depending upon design considerations. FIG. 18 illustrates a side view of the speed sensor 1300 depicted in FIGS. 13-16 in accordance with a preferred embodiment. Similarly, FIG. 19 illustrates a side sectional view of the speed sensor 1300 depicted in FIGS. 13-18 in accordance with a preferred embodiment. Likewise, FIG. 20 illustrates a sectional view of the speed sensor 1300 depicted in FIGS. 13-19 in accordance with a preferred embodiment.

A number of advantages can result from implementing the embodiments discussed herein. For example the cooler temperatures of approximately 190° C., for example, on the compressor housing side of the turbocharger allow all of the integrated circuits (IC's) and signal-conditioning electronics to be packaged together and over-molded with a thermoplastic into a single package with integral connectors. This eliminates the need for a so-called "pigtail" or wire-harness version of the sensor to remotely locate the electrical components. A single integrated package as described herein can therefore reduce the number of components required along with associated material costs and manufacturing processes that may be needed in a "pigtail" version. The use of an integral connector, for example, allows for enhanced sealing by eliminating multiple interconnects that are utilized in conventional "pigtail" versions.

As provided by the apparatus and methodology disclosed herein, a much smaller package size can be accomplished by placing the sensing element 202 and/or electrical components 204, 206, 208, 210, and 212 directly on the lead frame substrate 100. All other signal conditioning electronic components, for example, can be placed on the same lead frame substrate 100 in the same manner, thereby eliminating the need for a PCB or ceramic substrate. This also eliminates the need for an additional thickness of encapsulation over the electronics, thereby providing a smaller package size. Note that the same chip on lead frame methodology as adapted for use in configuring the turbocharger speed sensor 1300 can also be utilized in a number of other sensor applications to reduce components and allow for small package sizes.

FIGS. 1-20 generally describe a method for forming a sensor over-mold apparatus, such as the turbocharger speed sensor 1300. In general, the sensor subassembly 900 can be provided, which can include one or more electrical components, such as, for example, the sensing element 202 and/or electrical components 204, 206, 208, 210, and 212, which can be utilized for performing a sensing operation (e.g., turbocharger speed sensing). A step can be implemented for configuring the lead frame 100 to include the electrically conducting terminals 106, 108, 110, wherein said lead frame 100 forms a part of said sensor subassembly 900 in order to permit the terminals 106, 108, 110 to communicate electrically with the sensing element 202 and/or electrical components 204, 206, 208, 210, and 212 of said sensor subassembly 900.

A step can then be performed in which the thermoplastic material 1302 is over-molded about said sensor subassembly 900 to form the sensor over-mold apparatus 1300 in the form of a thermoplastic package that can withstand high-temperature environments, such as, for example those in automotive applications. Initial steps can be performed for locating the magnetic sensing component 202 on the lead frame 100 and over-molding the magnetic sensing component 202 with the thermoset material 112.

As indicated previously, the thermoset material 112 can comprise epoxy. A step can also be performed for utilizing the conducting terminals 106, 108, 110 of the lead frame 100 to locate the sensor subassembly 900 in a mold comprising such thermoplastic material during an over-molding of the sensor subassembly 900. Additionally, as indicated previously, one or more retractable pin locating features 1700 can be associated with the sensor subassembly 900. A step can be performed in which such retractable pin(s) 1700 can be pulled during an over-molding operation of the sensor subassembly 900 by the thermoplastic material 1302 to allow for the complete coverage of the thermoset material 112 about the sensor subassembly 900.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A sensor over-mold apparatus, comprising:
a sensor subassembly comprising a plurality of electrical components for performing a sensing operation;
a lead frame comprising a plurality of electrically conducting terminals, wherein said lead frame forms a part of said sensor subassembly, wherein said plurality of electrically conducting terminals communicate electrically with said plurality of electrical components of said sensor subassembly; and
a thermoplastic material over-molded about said sensor subassembly to form a sensor over-mold apparatus comprising a thermoset package that can withstand high-temperature environments; and
a magnetic sensing component located on said lead frame and over-molded with a thermoset material on said lead frame, wherein said thermoset material is further over-molded about said plurality of electrically conducting materials.

2. The apparatus of claim 1 wherein said thermoset material comprises an epoxy molding compound.

3. The apparatus of claim 1 wherein said plurality of electrically conducting terminals of said lead frame are utilized to locate said subassembly in a mold comprising said thermoplastic material during an over-molding of said sensor subassembly with said thermoplastic material.

4. The apparatus of claim 3 further comprising at least one retractable pin accepting feature for receiving a retractable pin associated with said sensor subassembly, wherein said at least one retractable pin is pullable during said over-molding of said sensor assembly with said thermoplastic material to allow for a complete coverage of said thermoplastic material about said sensor subassembly.

5. The apparatus of claim 1 wherein said high-temperature environment comprises a temperature greater than or approximately equal to 200° C.

6. The apparatus of claim 1 wherein said sensor over-mold apparatus comprises a speed sensor.

7. The apparatus of claim 6 wherein said speed sensor comprises a turbocharger speed sensor.

8. A sensor over-mold apparatus, comprising:
a sensor subassembly comprising a plurality of electrical components for performing a sensing operation;
a lead frame comprising a plurality of electrically conducting terminals, wherein said lead frame forms a part of said sensor subassembly, wherein said plurality of electrically conduction terminals communicate electrically with said plurality of electrical components of said sensor subassembly;
a magnetic sensing component located on said lead frame and over-molded with a thermoset material on said lead frame, wherein said thermoset material is further over-molded about said plurality of electrically conducting materials, such that said plurality of electrically conducting terminals of said lead frame are utilized to locate said subassembly in a mold comprising said thermoplastic material during an over-molding of said sensor subassembly with said thermoplastic material; and
a thermoplastic material over-molded about said sensor subassembly to form a sensor over-mold apparatus comprising a thermoset package that can withstand high-temperature environments.

9. The apparatus of claim 8 wherein said thermoset material comprises an epoxy molding compound and wherein said thermoplastic material comprises Polyphenylene Sulfide (PPS).

10. The apparatus of claim 8 further comprising at least one retractable pin accepting feature for receiving a retractable pin associated with said sensor subassembly, wherein said at least one retractable pin is pullable during said over-molding of said sensor assembly with said thermoplastic material to allow for a complete coverage of said thermoplastic material about said sensor subassembly.

11. The apparatus of claim 8 wherein said high-temperature environment comprises a temperature greater than or approximately equal to 200° C.

12. The apparatus of claim 8 wherein said sensor over-mold apparatus comprises a speed sensor.

13. The apparatus of claim 12 wherein said speed sensor comprises a turbocharger speed sensor.

14. A sensor over-mold apparatus, comprising:
a sensor subassembly comprising a plurality of electrical components for performing a sensing operation;
a lead frame comprising a plurality of electrically conducting terminals, wherein said lead frame forms a part of said sensor subassembly, wherein said plurality of electrically conducting terminals communicate electrically with said plurality of electrical components of said sensor subassembly; and
a thermoplastic material over-molded about said sensor subassembly to form a sensor over-mold apparatus comprising a thermoset package that can withstand high-temperature environments, wherein said thermoset material comprises an epoxy molding compound; and
at least one retractable pin accepting feature for receiving a retractable pin associated with said sensor subassembly, wherein said at least one retractable pin is pullable during said over-molding of said sensor assembly with said thermoplastic material to allow for a complete coverage of said thermoplastic material about said sensor subassembly.

15. The apparatus of claim 14 wherein said high-temperature environment comprises a temperature greater than or approximately equal to 200° C.

16. The apparatus of claim 14 wherein said sensor over-mold apparatus comprises a speed sensor.

17. The apparatus of claim 14 wherein said speed sensor comprises a turbocharger speed sensor.

18. The apparatus of claim 14 wherein said thermoset material comprises an epoxy molding compound and wherein said thermoplastic material comprises Polyphenylene Sulfide (PPS).

* * * * *